United States Patent [19]

Rice et al.

[11] Patent Number: 4,699,465
[45] Date of Patent: Oct. 13, 1987

[54] LASER DIODE ARRAY WITH PHASE CORRECTION

[75] Inventors: Robert R. Rice, Florissant, Mo.; Jeffrey R. Heidel, Red Bud, Ill.

[73] Assignee: McDonnell Douglas Corporation, St. Louis, Mo.

[21] Appl. No.: 829,422

[22] Filed: Feb. 13, 1986

[51] Int. Cl.$^4$ .................. G02B 5/18; H01L 27/10
[52] U.S. Cl. .............................. 350/162.11; 357/45
[58] Field of Search ............... 350/162.11, 162.17, 350/162.2; 357/45; 250/494.1; 340/782; 372/18, 50

[56] References Cited

U.S. PATENT DOCUMENTS 3,482,107 12/1969 Hock .................................. 350/162.17
4,641,311 2/1987 Ackley ................................ 372/18

Primary Examiner—Bruce Y. Arnold
Attorney, Agent, or Firm—Rogers, Howell, Moore & Haferkamp

[57] ABSTRACT

A laser diode array produces one set of beams that are out of phase with those of another set of beams, with the beams of one set alternating with those of the other. The phase plate has first and second sets of regions, with the regions of one set alternating with those of the other. The phase plate is positioned in the near field of the beam pattern such that one set of beams passes through one set of regions and the other set of beams passes through the other set of regions. One set of regions changes the phase of the beams passing therethrough to create a substantially single lobed beam pattern in the far field.

10 Claims, 5 Drawing Figures

LASER DIODE ARRAY WITH PHASE CORRECTION

BACKGROUND AND SUMMARY OF THE INVENTION

This invention generally relates to laser diode arrays, and more specifically to such arrays sometimes referred to as multi-stripe arrays that produce multiple laser beams with adjacent beams being 180° out of phase.

This phase relationship produces a double lobed beam pattern in the far field of the laser array which for some applications is undesirable. In accordance with the present invention, this out of phase relationship of the beams is corrected so that the beams are in phase and a single lobed beam pattern is produced in the far field.

Methods for generating single lobed far field patterns from a laser diode phased array have been reported in literature. See for example, J. Katz, S. Margalit, and A. Yariv, "Diffraction Coupled Phase-Locked Semiconductor Laser Array," Appl. Phys. Lett., Vol. 42, No. 7, 1983, pp. 554–556; J. Katz, Invention report prepared by J. T. English, "Semiconductor Laser Phased Array," NASA Tech. Brief, Vol. 8, No. 3, Item #6 from JPL Invention Report NPO-15963/5417; J. E. Epler, N. Holonyak, Jr., R. D. Burnham, T. L. Paoli, and W. Streifer, "Far Field Supermode Patterns of a Multiple-Stripe Quantum Well Heterostructure Laser Operated (~7330 A, 300к) in an External Grating Cavity," App. Phys. Lett., Vol. 45, 1984, pp. 406–408; and D. E. Ackley, D. Botez and B. Bogner, "Phase-Locked Injection Laser Arrays with Integrated Phase Shifters," RCA Review, Vol. 44, 1983, pp. 625–633. In the last of these articles the author describes a concept for achieving zero phase shifts between all of the array elements by coating selected ones of the diode array facets so that the beams are in phase and a single lobed far field pattern is achieved. It is not known to applicant whether that concept has been successfully implemented. By the present invention, a single lobed far field pattern is achieved by the use of a separate phase corrector plate positioned in the near field at the image of the array facet, such that the beams after passing through the phase corrector plate are substantially in phase. This technique is easy and inexpensive to implement.

Generally in accordance with the invention there is provided a phase corrector plate having multiple sets of regions. The phase plate is positioned in the near field of the beam pattern such that the beams of one phase from the laser diode array pass through one set of regions, and the beams of the other phase from the laser diode array pass through the other set of regions. One set of regions has means, such as a coating, to change the phase of the beams passing therethrough so as to be substantially in phase with the beams that pass through the other set of regions. As a result, all of the beams passing through the phase plate are in phase to produce a single lobed beam pattern in the far field.

The invention will be more specifically described in connection with the drawings and detailed description that follow.

DETAILED DESCRIPTION OF A PREFERRED EMBODIMENT

Figure 4A:
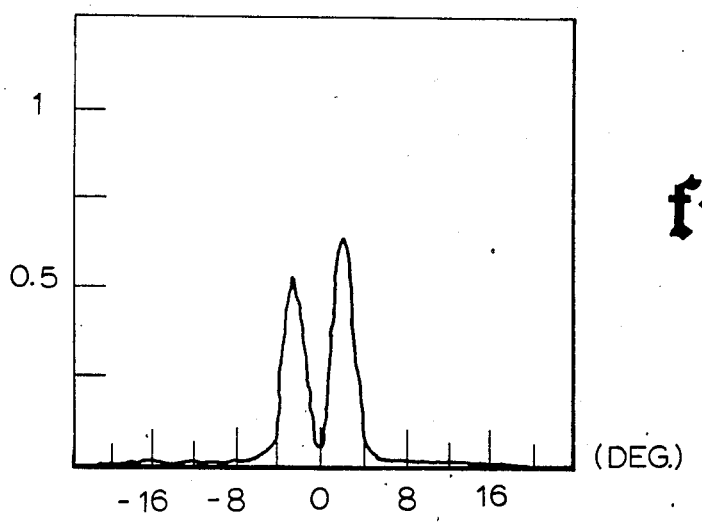
FIGS. 4A and 4B are beam patterns in the far field with FIG. 4A showing a double lobed beam pattern without use of the phase plate of the present invention, and FIG. 4B showing a single lobed beam pattern with the use of the phase plate of the present invention.
Figure 4B:
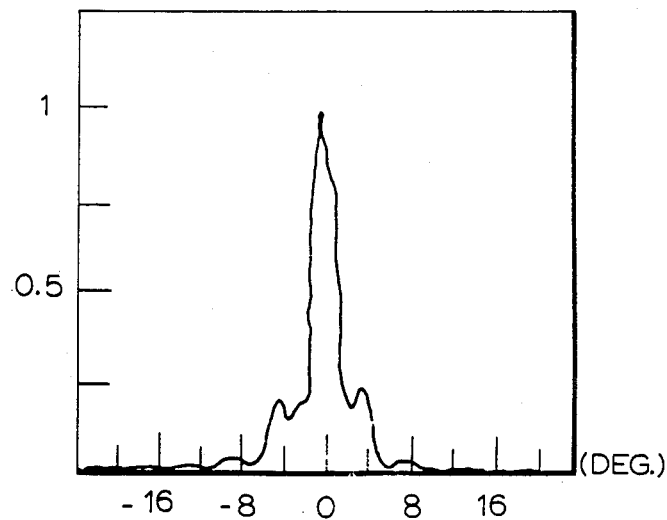

With reference to the drawing, the present invention includes a laser diode array 10 and phase corrector plate 12. The laser diode array 10 is of a type well known in the art and is sometimes referred to as a multi-stripe array or phased array. The array may be thought of as producing two sets of in line laser beams such that the beams of one set are 180° out of phase and alternate with those of the other. Because of the out of phase relationship of the beams, a double lobed beam pattern is produced in the far field as illustrated in FIG. 4A. The purpose of the phase plate 12 is to correct the phase relationship of the beams so that all of the beams are in phase to produce a single lobed beam pattern in the far field as illustrated in FIG. 4B.

Figure 2:
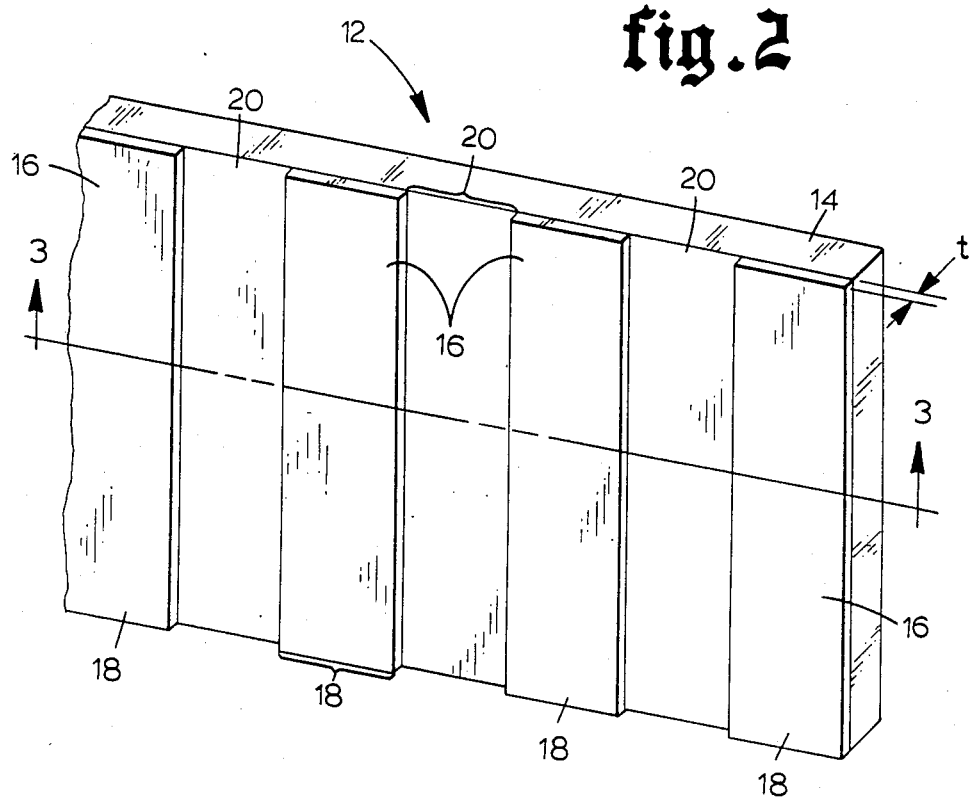
FIG. 2 is a perspective view of a phase plate in accordance with the present invention.
Figure 3:
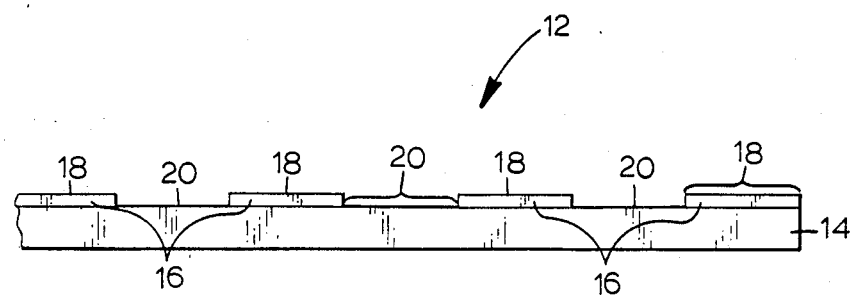
FIG. 3 is a view in section taken generally along the line 3—3 of FIG. 2.

The phase plate 12 is shown in greater detail in FIGS. 2 and 3. It includes a base plate 14 with coatings 16 thereon. The coatings 16 are spaced apart to define a first set of regions 18, and a second set of regions 20, the regions of one set alternating with those of the other. Both the base plate and coatings may be of silicon dioxide or other suitable material through which the laser beams may pass.

The widths of the regions 18 and 20 should be such that one set of beams passes only through one set of regions, and the other set of beams passes only through the other set of regions. It is preferred that the width of each region be greater than the width of the beam passing therethrough to assure that it captures the entire beam and to take into account any beam divergence. The phase plate is positioned in the near field of the beam pattern with each beam passing through a region, and each region capturing an entire beam.

The thickness t of the coating 16 is determined by the formula $t = \lambda/2(n-1)$ where $\lambda$ is the wavelength of the beams of the array, and n is the index of refraction of the coating material.

Figure 1:
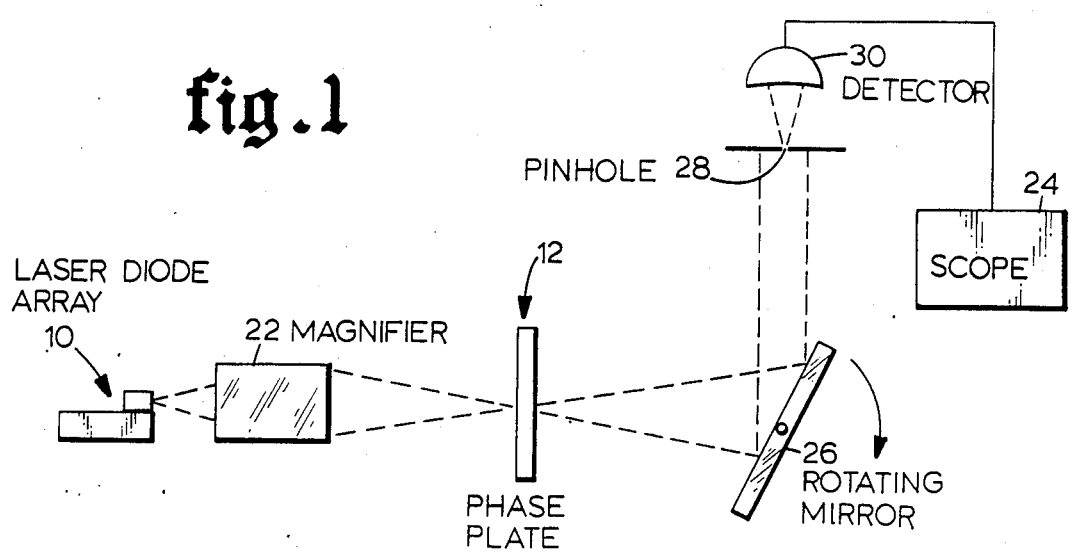
FIG. 1 is a schematic diagram showing the combination of a laser diode array and phase plate in accordance with the present invention, and a test set-up for observing the beam pattern in the far field.

FIG. 1 illustrates a test set-up for observing the far field beam pattern with and without the phase plate of the present invention. The test set-up used a Siemans gain-guided twelve stripe diode array, with the stripes or beams produced by each diode being 3 microns wide on ten micron center-to-center spacings. Adjacent beams from the array were 180° out of phase. The phase plate was constructed with the widths of the coatings equal to sixty microns on one hundred and twenty micron center-to-center spacings. This means that the width of each region 18 was sixty microns, and the width of each region 20 was sixty microns. Both the base and coatings were of silicon dioxide. The thickness of the coatings was generally in accordance with the above formula. The phase plate was located in the near field of the beam pattern. A magnifier 22 was placed between the diode array and phase plate to produce a 6:1 magnification at the image where the phase plate was located. The far field beam pattern was observed on a scope 24 by means of a rotating mirror 26, pin hole 28, and detector 30 using 450 mA drive current and 60 mW optical power. With the phase plate in place such that the beams of one set of beams passed only through the regions 18 and the beams of the other set passed only through the regions 20, a single lobed beam pattern was observed on the scope generally as shown in FIG. 4B (normalized intensity). Without the phase plate, a double lobed beam pattern was observed on the scope similar to that of FIG. 4A (normalized intensity).

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. In a laser diode array having laser beams of one set of beams out of phase with those of another set, the beams of one set alternating with those of the other, the improvement comprising means for changing the phase of the beams of one set to create substantially a single lobed beam pattern in the far field, said means for changing the phase further comprising a phase plate positioned in the near field of the beam pattern, said phase plate having first and second sets of regions, the regions of one set alternating with those of the other, the phase plate being so positioned in the near field that one set of beams passes through one set of regions and the other set of beams passes through the other set of regions, at least one set of regions having means to change the phase of the beams passing therethrough.

2. In the laser diode array of claim 1 wherein said means of said one set of regions change the phase of the beams passing therethrough to be substantially in phase with the beams that pass through the other set of regions.

3. In the laser diode array of claim 2 wherein said means of said one set of regions further comprises a coating through which said one set of beams pass, said coating changing the phase of the beams passing therethrough.

4. In the laser diode array of claim 3 wherein the thickness of the coating is equal to $\lambda/2(n-1)$, where $\lambda$ is the wave length of the beams of the array, and n is the index of refraction of the coating material.

5. In the laser diode array of claim 4 wherein said coating is silicon dioxide.

6. In the laser diode array of claim 1 wherein each region captures the entire beam passing therethrough.

7. In the laser diode array of claim 1 wherein the beams of one set from the laser diode are 180° out of phase with the beams of the other set of beams from the laser diode, the regions of one set of regions changing the phase of the beams passing therethrough 180°, whereby all of the beams are substantially in phase after passing through the phase plate to produce a substantially single lobed beam pattern in the far field.

8. In a laser diode array having laser beams of one set of beams 180° out of phase with those of another set, the improvement comprising means for changing the phase of the beams of one set to create substantially a single lobed beam pattern in the far field, said means for changing the phase further comprising a phase plate positioned in the near field of the beam pattern, said phase plate having first and second sets of regions, the phase plate being so positioned in the near field that one set of beams passes through one set of regions and the other set of beams passes through the other set of regions, each region capturing the entire beam passing therethrough, one set of regions having coating means to change the phase of the beams passing therethrough to be substantially in phase with the beams that pass through the other set or regions, whereby all of the beams are in phase after passing through the phase plate to produce a substantially single lobed beam pattern in the far field.

9. In the laser diode array of claim 8 wherein the beams of one set alternate with those of the other, and further wherein the regions of one set alternate with those of the other.

10. In a laser diode array having laser beams of one set of beams out of phase with those of another set, the improvement comprising means for changing the phase of the beams of one set to create substantially a single lobed beam pattern in the far field, said means for changing the phase further comprising a phase plate positioned in the near field of the beam pattern, said phase plate having first and second sets of regions, the phase plate being so positioned in the near field that one set of beams passes through one set of regions and another set of beams passes through the other set of regions, at least one set of regions having means to change the phase of the beams passing therethrough.

* * * * *